(12) United States Patent
Li et al.

(10) Patent No.: US 11,239,839 B2
(45) Date of Patent: Feb. 1, 2022

(54) GATE DRIVER WITH $V_{GTH}$ AND $V_{CESAT}$ MEASUREMENT CAPABILITY FOR THE STATE OF HEALTH MONITOR

(71) Applicant: Texas Instruments Incorporated, Dallas, TX (US)

(72) Inventors: Xiong Li, Plano, TX (US); Anant Kamath, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/014,828

(22) Filed: Sep. 8, 2020

(65) Prior Publication Data

US 2020/0412360 A1  Dec. 31, 2020

Related U.S. Application Data

(60) Division of application No. 16/371,331, filed on Apr. 1, 2019, now Pat. No. 10,771,052, which is a
(Continued)

(51) Int. Cl.
*G01R 31/26* (2020.01)
*H03K 17/18* (2006.01)
(Continued)

(52) U.S. Cl.
CPC ....... *H03K 17/567* (2013.01); *G01R 31/2608* (2013.01); *G01R 31/2621* (2013.01);
(Continued)

(58) Field of Classification Search
CPC ............ G01R 31/2608; G01R 31/2621; G01R 31/2817; G01R 31/2837; G01R 31/2849; G01R 31/42; H03K 17/18; H03K 17/567
(Continued)

(56) References Cited

U.S. PATENT DOCUMENTS 9,379,621 B1  6/2016 Kalyanaranman et al.
10,033,377 B2 * 7/2018 Liang ............... H03K 17/08116
(Continued)

OTHER PUBLICATIONS

E. Wolfgang, Examples for Failures in Power Electronics Systems. In ECPE Tutorial on Reliability of Power Electronic Systems, Apr. 2007 (28 pages).
(Continued)

*Primary Examiner* — William Hernandez
(74) *Attorney, Agent, or Firm* — Valerie M. Davis; Charles A. Brill; Frank D. Cimino

(57) ABSTRACT

In a power supply system, a high-side (HS) insulated-gate bipolar transistor (IGBT) has a first collector, a first gate, and a first emitter. A low-side (LS) IGBT has a second collector coupled to the first emitter, a second gate, and a second emitter. A gate drive circuit is coupled to the first gate of the HS IGBT and the second gate of the LS IGBT. A control circuit is coupled to the gate drive circuit. The control circuit is configured to control the gate drive circuit for biasing the HS IGBT to a HS saturation, and determine a HS degradation of the HS IGBT based on a HS digitized gate voltage of the HS IGBT in the HS saturation.

6 Claims, 3 Drawing Sheets

Related U.S. Application Data continuation of application No. 15/728,230, filed on Oct. 9, 2017, now Pat. No. 10,291,225.

(60) Provisional application No. 62/405,380, filed on Oct. 7, 2016.

(51) Int. Cl.
*H03K 17/567* (2006.01)
*G01R 31/28* (2006.01)
*G01R 31/42* (2006.01)

(52) U.S. Cl.
CPC ..... *G01R 31/2817* (2013.01); *G01R 31/2837* (2013.01); *G01R 31/2849* (2013.01); *H03K 17/18* (2013.01); *G01R 31/42* (2013.01)

(58) Field of Classification Search
USPC ........................................ 327/108, 109, 581
See application file for complete search history.

(56) References Cited

U.S. PATENT DOCUMENTS

| | | | |
|---|---|---|---|
| 10,587,262 B1* | 3/2020 | Morini | H02M 1/08 |
| 2008/0143184 A1 | 6/2008 | Otsuga et al. | |
| 2016/0182039 A1 | 6/2016 | Xiao et al. | |
| 2019/0056448 A1 | 2/2019 | Asam | |

OTHER PUBLICATIONS

N. Patil, J. Celaya, D. Das, K. Goebel, and M. Pecht, "Precursor Parameter Identification for Insulated Gate Bipolar Transistor (IGBT) Prognostics," IEEE Trans. Rel., vol. 58, No. 2, pp. 271-276, Jun. 2009.

V. Smet, F. Forest, J.-J. Huselstein, A. Rashed, and F. Richardeau, "Evaluation of Vce Monitoring as a Real-Time Method to Estimate Aging of Bond Wire-IGBT Modules Stressed by Power Cycling," IEEE Trans. Ind. Electron., vol. 60, No. 7, pp. 2760-2770, Jul. 2013.

B. Ji, V. Picked, W. Cao, and B. Zahawi, "In Situ Diagnostics and Prognostics of Wire Bonding Faults in IGBT Modules for Electric Vehicle Drives," IEEE Trans. Power Electron., vol. 28, No. 12, pp. 5568-5577, Dec. 2013.

Y. Xiong, X. Cheng, Z. J. Shen,C.Mi, H.Wu, andV. K. Garg, "Prognostic and Warning System for Power-Electronic Modules in Electric, Hybrid Electric, and Fuel-Cell Vehicles," IEEE Trans. Ind. Electron., vol. 55, No. 6, pp. 2268-2276, Jun. 2008.

M. Bouarroudj, Z. Khatir, J. P. Ousten, F. Badel, L. Dupont, and S. Lefebvre, "Degradation behavior of 600 V-200 A IGBT modules under power cycling and high temperature environment conditions," Microelectron. Rel., vol. 47, pp. 1719-1724, 2007.

* cited by examiner

US 11,239,839 B2

GATE DRIVER WITH $V_{GTH}$ AND $V_{CESAT}$ MEASUREMENT CAPABILITY FOR THE STATE OF HEALTH MONITOR

CROSS-REFERENCE TO RELATED APPLICATIONS

This application is a divisional of U.S. patent application Ser. No. 16/371,331, filed Apr. 1, 2019, which is a continuation of U.S. patent application Ser. No. 15/728,230 filed Oct. 9, 2017 (issued as U.S. Pat. No. 10,291,225), which claims priority to U.S. Provisional Patent Application No. 62/405,380 filed Oct. 7, 2016, all of which are hereby fully incorporated herein by reference.

BACKGROUND

In the design of a power electronics converter, much attention may be paid to the power conversion efficiency, power density, and system cost. Recently, the reliability performance of power electronic systems is gaining more and more attention, especially for those systems with long operation hours in a harsh environment. The reliability of a system has a significant effect on the life cycle cost of the system.

Semiconductor failures may account for a large percentage of system failures of power electronic systems. The reliability of insulated gate bipolar transistor (IGBT) modules has been improved substantially for the past decade with the help of advanced designs and optimized use of materials. Reliability assessment of IGBT modules may be used during the production stage for mission-critical applications such as transportation, military, aerospace, and offshore wind power in an attempt to guarantee reliable operations over life time. Different techniques may be used to implement condition monitor (CM) of IGBTs. The CM approach for IGBT modules aims to detect changes in parameters indicative of die and package degradation during operation. Collector-emitter saturation voltage $V_{CESAT}$ and threshold voltage $V_{GTH}$ may be two reliable precursors of IGBT failures. Conventional approaches for measuring these two parameters involves removing a module, holding one or more IGBTs, from its associated application and connecting the module for IGBT testing by dedicated test equipment such as power device analyzer. An uncomplicated method and device for condition monitoring, especially in an operational field setting, are needed for measuring important parameters such as $V_{CESAT}$ and $V_{GTH}$.

SUMMARY

In a power supply system, a high-side (HS) insulated-gate bipolar transistor (IGBT) has a first collector, a first gate, and a first emitter. A low-side (LS) IGBT has a second collector coupled to the first emitter, a second gate, and a second emitter. A gate drive circuit is coupled to the first gate of the HS IGBT and the second gate of the LS IGBT. A control circuit is coupled to the gate drive circuit. The control circuit is configured to control the gate drive circuit for biasing the HS IGBT to a HS saturation, and determine a HS degradation of the HS IGBT based on a HS digitized gate voltage of the HS IGBT in the HS saturation.

DETAILED DESCRIPTION OF EXAMPLE EMBODIMENTS

Figure 1:
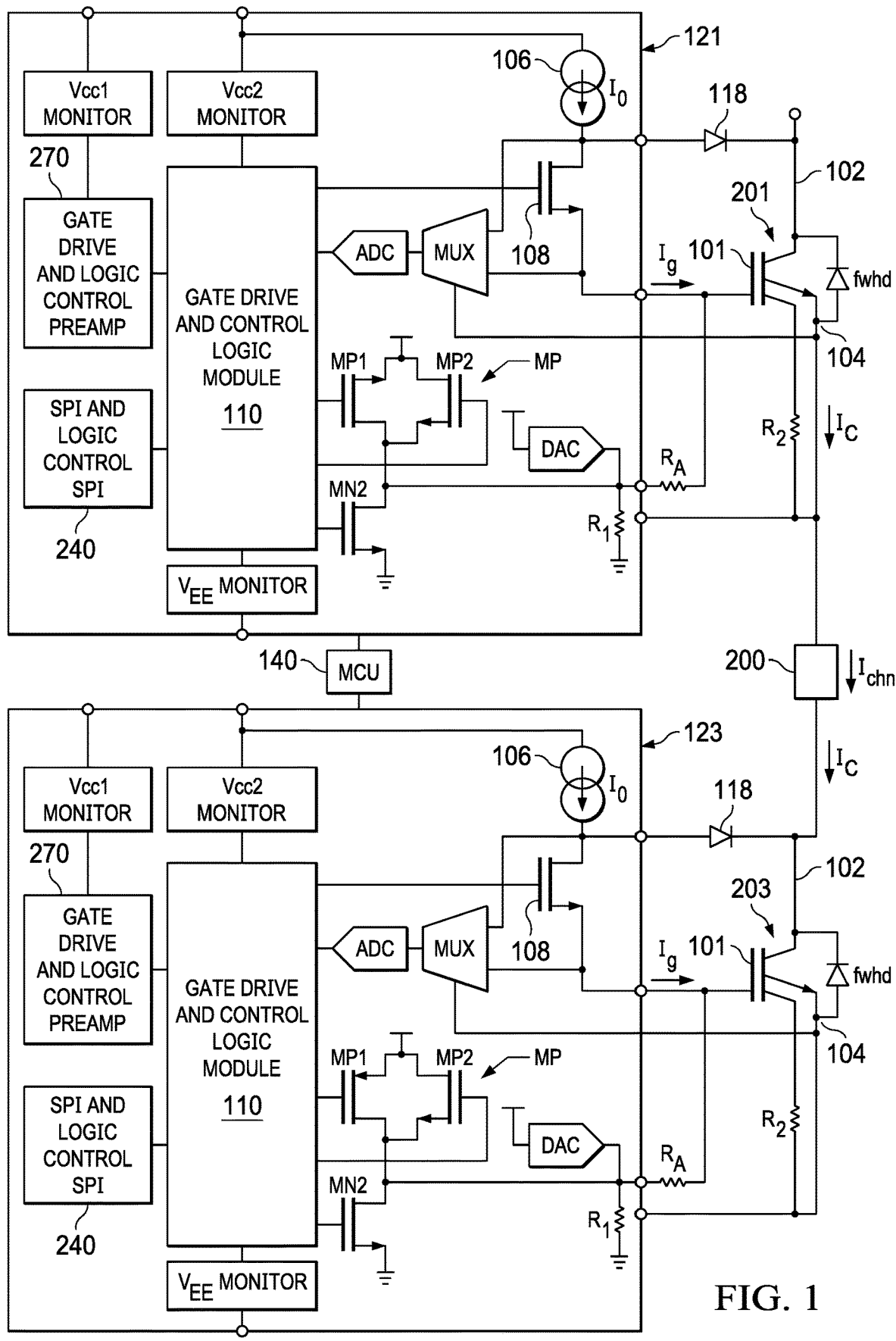
FIG. 1 illustrates a schematic/diagram drawing of two IGBT gate drivers connected in a half-bridge fashion.

In the drawings, like reference numerals refer to like elements.

FIG. 1 illustrates a schematic/diagram drawing of two IGBT gate drivers (121,123) for two IGBTs (201, 203) that are connected in a half-bridge fashion. This schematic may be implemented in a driver module that houses two or more IGBT gate drivers. Gate driver 121 shall be referred to herein as the upper gate driver 121 and gate driver 123 shall be referred to herein as the lower gate driver. IGBT 201 and 203 each have gate 100, collector 102 and emitter 104. Gate 101 of each IGBT is coupled to its collector 102 through a high voltage diode 118 that serves as a DESAT diode. Freewheeling diode fwhd is illustrated as connected in a reversed biased manner from the collector to the emitter of each IGBT to emphasize the forward conduction-only aspect of the IGBT. Current source 106 is connected to the input or anode of diode 118 and also to gate 101 through pass transistor 108. Half-bridges are often used in connection with power conversion and the associated IGBTs (201, 203) are connected together in cascode, at junction 200, wherein the emitter of IGBT 201 is connected to the collector of IGBT 203. Isolated IGBT gate drivers are used to drive IGBTs ON and OFF in a proper fashion (in normal driver operation, one IGBT is off when the other IGBT is on) while providing galvanic isolation. In an advanced isolated IGBT gate driver, different active protection features like desaturation (DESAT) based short circuit fault detection, active Miller clamp, and soft turn-off functions are included in order to drive IGBTs in a more robust pattern. Regarding the DESAT based short circuit fault detection, a current source generated inside the driver is used to charge an external blanking capacitor, thus providing a blanking time to prevent false fault triggering. A high voltage DESAT diode is used to block the high voltage from the IGBT collector. In this disclosure, portions of DESAT detection circuit may be reused to measure the VCESAT and VGTH for the purpose of an IGBT condition monitor.

$V_{CESAT}$ and $V_{GTH}$ may convey information that serves as reliable precursors to IGBT failure. Knowing the values of these two parameters may provide knowledge of device changes as the values of these parameters may change over time, yielding predictive insight into future device failures. As an IGBT gate driver is usually located close to the IGBT, and has access to the three terminals of the IGBT, it is advantageous to integrate new circuits or repurpose existing circuits to enable the functions of VGTH and VCESAT measurement. Drivers for facilitating parameter measurements and procedures for making those measurements are presented herein, thereby allowing the parameter measurements to be elicited in the field in conjunction with a module, holding the drivers, being used in the field. The approach herein bring benefits regarding reduced system bill of material (BOM) and board space as compared with conventional approaches which require separate dedicated measuring equipment.

$V_{GTH}$ denotes the gate-emitter threshold voltage of an IGBT (e.g., the gate-emitter turn-on threshold voltage). In connection with determining $V_{GTH}$, for example, IGBT 201, gate drive and control logic module 110 supplies current to gate 101 from current source 106 in connection with turning on pass transistor 108 connecting current source 106 with gate 101, building up charges on gate 101, and thereby increasing gate voltage. Module 110 may be a processor which is programmed with instructions to control gate driving functions of transistors located on or connected to drivers as depicted herein. The voltage level between gate 101 and emitter 104 reaches a level where IGBT 201 turns on, at which point collector current begins to flow. Determining $V_{GTH}$ for IGBT 201 may be accomplished using analog-to-digital converter ADC. Analog-to-digital converter ADC samples voltage across the collector-emitter terminals or gate emitter terminals of IGBT 201 in connection with selection by multiplexer MUX. Multiplier MUX may select measurement terminals for measuring $V_{GTH}$ in connection with multiplier MUX being selectively coupled to gate 101 and emitter 104.

Figure 2:
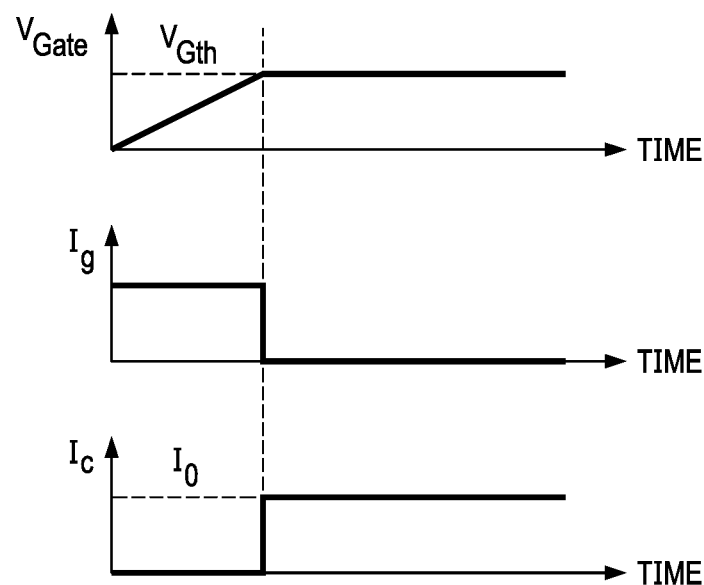
FIG. 2 illustrates a graph of gate-emitter voltage $V_{gate}$, current source current collector current $I_c$, and gate current $I_g$.

The measurement of $V_{GTH}$ may be accomplished by analog-to-digital converter ADC, which serves as a digital meter, in accordance with commands given to module 110 by microcontroller 140. Continued reference is made to FIG. 1 and in addition, to FIG. 2 which illustrates a graph of gate-emitter voltage $V_{gate}$, current source current $I_0$, collector current $I_c$, and gate current $I_g$. Current source 106 provides current $I_0$ through pass transistor 108, and delivers gate current gate $I_g$ to gate 101 to switch on IGBT 201. Charges on gate 101 are built up and the gate-emitter voltage of IGBT 201 increases. IGBT 201 turns on in connection with its gate-emitter voltage, $V_{gate}$, reaching its threshold voltage level $V_{GTH}$, at which point gate current $I_g$ eventually stops flowing and the current source $I_0$ starts to flow through the IGBT channel, under which condition the collector current $I_e$ is equal to $I_0$. DESAT diode 118 prevents gate driver from damage because of high voltage exists at the collector 102. $V_{GTH}$ for IGBT 203 in driver 123 may likewise be measured in the same fashion as that of $V_{GTH}$ for IGBT 201.

Figure 3:
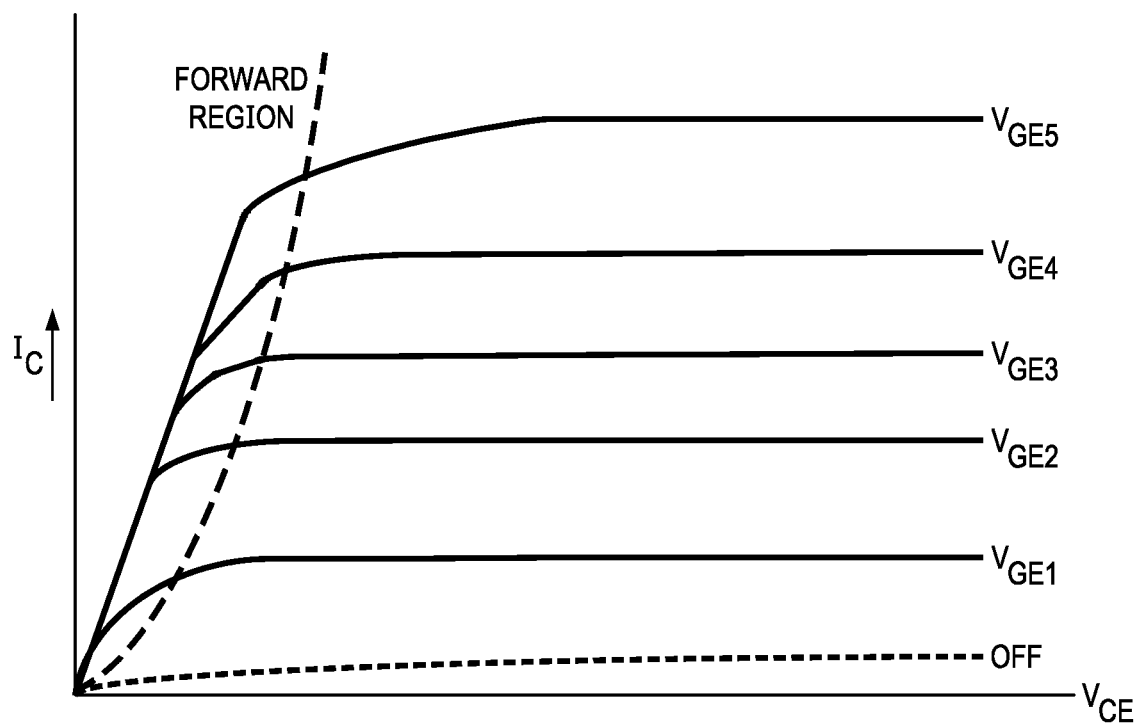
FIG. 3 illustrates transfer characteristics of collector current v. collector-emitter voltage for corresponding to various values of gate-emitter voltage $V_{GE}$.

The collector-emitter voltage, of an IGBT under saturation, $V_{CESAT}$, is a conditional voltage that is dependent upon the value of the collector current and temperature of the IGBT under test. FIG. 3 illustrates transfer characteristics of collector current v. collector-emitter voltage corresponding to various values of gate-emitter voltage $V_{GE}$. $V_{CESAT}$ occurs at the "knee" of each curve at which point the collector current becomes substantially constant, indicating non-responsiveness collector-emitter voltage to collector current.

In order to determine $V_{CESAT}$ for IGBT 201, IGBT 203 is turned on (and it is kept operating in its forward active region). The gate voltage of IGBT 203 can be controlled through adjusting the current $I_1$ flowing through $R_1$. The current $I_1$ can be regulated through a current DAC. Digital levels corresponding to gate voltage values may be set by digital-to-analog converter DAC on driver 123 for input of voltage levels to gate 101 of IGBT 203. In one embodiment, pull up device MP which may be implemented as PMOS device MP1 and NMOS device MP2 connected together at each respective drain/source. MP1 and MP2 may be driven separately in connection with a gate driven by module 110 to pull up gate voltage at gate 101 of IGBT 203 in conjunction with the current supplied by the lower side driver's DAC. Pull down NMOS MN2 is also shown in FIG. 1 and it may be used to pull charge off of gate 101 in order to turn off an associated IGBT. Next, in connection with commands from gate drive input and control logic module 110 of driver 121, IGBT 201 is turned on by activating transistor MP1 of driver 121. Effectively, for the IGBT 201 and IGBT 203, the collector-emitter channel currents through each device may be considered, for purposes of analysis, as the same. The current drawn through the channel of IGBT 201 can be controlled through adjusting the gate voltage at gate 101 of IGBT 203. Points along a curve in FIG. 3, correspond to adjustments in gate-emitter voltage for IGBT 203, causing changes in collector current in the forward region. At the point where an increase in gate-emitter voltage, $V_{CE}$, for IGBT 203 no longer results in an increase in channel current through both IGBT devices (IGBT 201 and IGBT 203), which may be considered the collector current for IGBT 201, $V_{CESAT}$ has been reached for IGBT 201 for the particular level of gate-emitter voltage at IGBT 201. At the point of invariance of collector current/channel current to VCE, the measurement of $V_{CE}$ for IGBT 201 serves as $V_{CESAT}$ for IGBT 201. $V_{CESAT}$ for IGBT 203 is shown in FIG. 3 for the various curves indicated at a particular subscripted gate-emitter voltage on an IGBT such as IGBT 203. It is noted that a value shown in FIG. 3 representative of $V_{CESAT}$ for IGBT 203 may not necessarily be the same as the measured value of $V_{CESAT}$ for an IGBT under test such as IGBT 201, the two IGBTs being bound to one another through a substantially common channel/collector current which need not require the same gate-emitter voltage for the two IGBTs 201 and 203. With the gate-emitter voltage of the IGBT under $V_{CESAT}$ test (e.g., IGBT 201) turned on, the collector channel current through IGBT 201 may be provided by adjusting the gate-emitter voltage of IGBT 203 as indicated in FIG. 3 in connection with operating IGBT 203 at less than its maximum gate-emitter voltage extent in its forward linear region, i.e. "partially on."

Analog-to-digital converter ADC in driver 121 may be employed to measure the collector emitter voltage of IGBT 201 while analog-to-digital converter ADC in driver 123 may be used to monitor for a constant channel current in connection with commands from MCU 140. Measurement data may be stored in memory within the driver or it may be transmitted to a remote location by transceiver 143 through processor 140.

In connection with facilitating commands from MCU 140, Serial Peripheral Interface (SPI) logic (for, among other things, directing serial data to respective drivers 120 and 123) and Gate Drive Input and Control Logic preamp 270 (which serves to condition signals to driver 110) control the operation of module 110. VCC1 monitor and VCC2 monitor, regulate the the Vcc supply voltage to Gate Monitor 110, Gate Drive Input and Control Logic preamp 270 and SPI logic and control module 240.

$V_{CESAT}$ for IGBT 203 may be measured in a similar fashion with IGBT 203 being turned fully on and IGBT 201 being partially turned on.

Figures 4, 5:
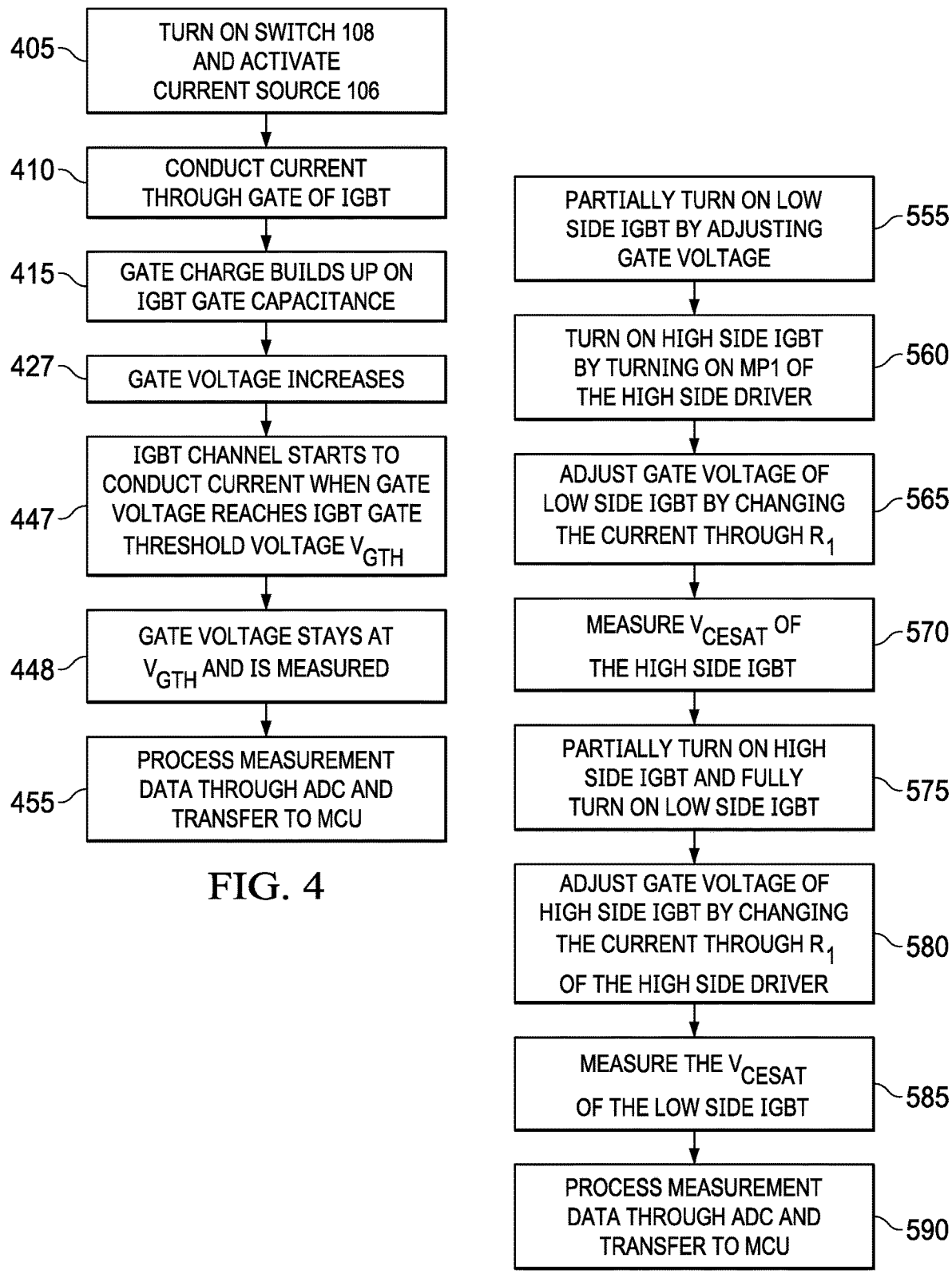
FIG. 4 is flowchart summarizing the steps for measuring $V_{GTH}$ of an IGBT.
FIG. 5 is flowchart summarizing the steps for measuring $V_{CESAT}$.

FIG. 4 is flowchart summarizing the steps for measuring $V_{GTH}$ for IGBT 201 of driver 121. At step 405, transistor (switch) 108 is turned on to provide current from current source 106 gate to 101. At step 410 current is conducted to the gate of IGBT 201. At step 415, gate charge builds up on gate 101, increasing the gate voltage of IGBT 201. Gate voltage increases at step 427. At step 447, IGBT 201 conducts current in connection with the gate threshold voltage being reached. Gate voltage is measured at step 448 and at step 455, the process measurement is processed through the analog-to-digital converter ADC and transferred to microcontroller MCU.

FIG. 5 is flowchart summarizing the steps for measuring $V_{CESAT}$. At step 555 the low side IGBT is turned on to an extent less than its maximum value and sufficient to cause the low side IGBT to operate in the forward region of its active area. The high side IGBT is turned on at step 560 by turning on pass transistor 108 of the high side gate driver to allow charging current from current source 106. At step 565, the gate voltage of the low side IGBT is adjusted by increasing the current $I_1$ through digital to analog converter (which serves as a current source) DAC of the low side driver. At step 570, VCESAT of the high side IGBT is measured and recorded in connection with determining the level of Vce which is no longer responsive to collector current changes for the IGBT under test. At step 575, in connection with measuring $V_{CESAT}$ for the low side IGBT, the high side IGBT is turned on (so as to operate in its linear region) while the low side IGBT is turned on. The gate voltage of the high side IGBT is adjusted (step 580) by changing the current $I_1$ through $R_1$ of the DAC of the high side driver. At step 585, $V_{CESAT}$ is measured and recorded in connection with determining the level of Vce which is no longer responsive to collector current changes for the IGBT under test. At step 590, process measurements are transferred through the respective analog-to-digital converter ADC of the drivers 120 and 123 to MCU 140.

The system of the embodiments presented or portions of the system thereof may be in the form of a "processing machine," such as a general-purpose computer, for example. As used herein, the term "processing machine" is to be understood to include at least one processor that uses at least one memory. The at least one memory stores a set of instructions. The instructions may be either permanently or temporarily stored in the memory or memories of the processing machine. The processor executes the instructions that are stored in the memory or memories in order to process data. The set of instructions may include various instructions that perform a particular task or tasks, such as those tasks described above. Such a set of instructions for performing a particular task may be characterized as a program, software program, or simply software.

As noted above, the processing machine executes the instructions that are stored in the memory or memories to process data. This processing of data may be in response to commands by a user or users of the processing machine, in response to previous processing, in response to a request by another processing machine and/or any other input, for example.

As noted above, the processing machine used to implement some embodiments may be a general purpose computer. However, the processing machine described above may also utilize any of a wide variety of other technologies including a special purpose computer, a computer system including, for example, a microcomputer, mini-computer or mainframe, a programmed microprocessor, a micro-controller, a peripheral integrated circuit element, a CSIC (Customer Specific Integrated Circuit) or ASIC (Application Specific Integrated Circuit) or other integrated circuit, a logic circuit, a digital signal processor, a programmable logic device ("PLD") such as a Field-Programmable Gate Array ("FPGA"), Programmable Logic Array ("PLA"), or Programmable Array Logic ("PAL"), or any other device or arrangement of devices that is capable of implementing the steps of the processes described.

The processing machine used to implement the foregoing may utilize a suitable operating system. Further, various technologies may be used to provide communication between the various processors and/or memories, as well as to allow the processors and/or the memories herein to communicate with any other entity, i.e., so as to obtain further instructions or to access and use remote memory stores, for example. Such technologies used to provide such communication might include a network, the Internet, Intranet, Extranet, LAN, an Ethernet, wireless communication via cell tower or satellite, or any client server system that provides communication, for example. Such communications technologies may use any suitable protocol such as TCP/IP, UDP, or OSI, for example.

As described above, a set of instructions may be used in the processing of the foregoing. The set of instructions may be in the form of a program or software. The software may be in the form of system software or application software, for example. The software might also be in the form of a collection of separate programs, a program module within a larger program, or a portion of a program module, for example. The software used might also include modular programming in the form of object-oriented programming. The software tells the processing machine what to do with the data being processed.

Further, the instructions or set of instructions used in the implementation and operation of the foregoing may be in a suitable form such that the processing machine may read the instructions. For example, the instructions that form a program may be in the form of a suitable programming language, which is converted to machine language or object code to allow the processor or processors to read the instructions. That is, written lines of programming code or source code, in a particular programming language, are converted to machine language using a compiler, assembler or interpreter. The machine language is binary coded machine instructions that are specific to a particular type of processing machine, i.e., to a particular type of computer, for example. The computer understands the machine language.

Any suitable programming language may be used in accordance with the various embodiments herein. Illustratively, the programming language used may include assembly language, Ada, APL, Basic, C, C++, COBOL, dBase, Forth, Fortran, Java, Modula-2, Pascal, Prolog, REXX, Visual Basic, and/or JavaScript, for example. Further, it is not necessary that a single type of instruction or single programming language be utilized in conjunction with the operation of the system and method herein. Rather, any number of different programming languages may be utilized as is necessary and/or desirable.

Also, the instructions and/or data used in the practice of the embodiments may utilize any compression or encryption technique or algorithm, as may be desired. An encryption module might be used to encrypt data. Further, files or other data may be decrypted using a suitable decryption module, for example.

As described above, some embodiments may illustratively be embodied in the form of a processing machine, including a computer or computer system, for example, that includes at least one memory. The set of instructions, such as the software, that enables the computer operating system to perform the operations described above may be contained on any of a wide variety of media or medium, as desired. Further, the data that is processed by the set of instructions might also be contained on any of a wide variety of media or medium. That is, the particular medium, i.e., the memory in the processing machine, utilized to hold the set of instructions and/or the data used in the embodiments may take on any of a variety of physical forms or transmissions, for example. Illustratively, the medium may be in the form of paper, paper transparencies, a compact disk, a DVD, an integrated circuit, a hard disk, a floppy disk, an optical disk, a magnetic tape, a RAM, a ROM, a PROM, an EPROM, a wire, a cable, a fiber, a communications channel, a satellite transmission, a memory card, a SIM card, or other remote transmission, as well as any other medium or source of data that may be read by processors.

Further, the memory or memories used in the processing machine that implement the foregoing may be in any of a wide variety of forms to allow the memory to hold instructions, data, or other information, as is desired. Thus, the memory might be in the form of a database to hold data. The database might use any desired arrangement of files such as a flat file arrangement or a relational database arrangement, for example.

All of the drivers and measurement systems described herein may be integrated within a semiconductor package and the package may contain wired or wireless communications devices such as a receiver and transmitter for receiving commands to a processor or sending data to a remote location.

Modifications are possible in the described examples, and other implementations are possible, within the scope of the claims.

What is claimed is:

1. A power supply system comprising:
   a high-side (HS) insulated-gate bipolar transistor (IGBT) having a first collector, a first gate, and a first emitter;
   a low-side (LS) IGBT having a second collector coupled to the first emitter, a second gate, and a second emitter;
   a gate drive circuit coupled to the first gate of the HS IGBT and the second gate of the LS IGBT; and
   a control circuit coupled to the gate drive circuit, the control circuit configured to control the gate drive circuit for biasing the HS IGBT to an HS saturation, and determine an HS degradation of the HS IGBT based on an HS digitized gate voltage of the HS IGBT when the HS IGBT is in the HS saturation.

2. The power supply system of claim 1, wherein the control circuit is configured to control the gate drive circuit for biasing the LS IGBT to an LS saturation, and determine an LS degradation of the LS IGBT based on an LS digitized gate voltage of the LS IGBT when the LS IGBT is in the LS saturation.

3. The power supply system of claim 1, wherein the control circuit is configured to control the gate drive circuit for setting a saturation current using the LS IGBT, and determine the HS degradation of the HS IGBT based on the saturation current and an HS digitized collector-emitter voltage of the HS IGBT when the HS IGBT is in the HS saturation.

4. The power supply system of claim 3, wherein the gate drive circuit partially turns on the LS IGBT and fully turns on the HS IGBT.

5. The power supply system of claim 1, wherein the control circuit is configured to control the gate drive circuit for setting a saturation current using the HS IGBT, and determine the LS degradation of the LS IGBT based on the saturation current and an LS digitized collector-emitter voltage of the LS IGBT when the LS IGBT in the LS saturation.

6. The power supply system of claim 5, wherein the gate drive circuit partially turns on the HS IGBT and fully turns on the LS IGBT.

* * * * *